(12) United States Patent
Uematsu

(10) Patent No.: US 7,323,277 B2
(45) Date of Patent: Jan. 29, 2008

(54) PHOTOMASK

(75) Inventor: Masaya Uematsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 572 days.

(21) Appl. No.: 10/938,989

(22) Filed: Sep. 10, 2004

(65) Prior Publication Data

US 2005/0058915 A1    Mar. 17, 2005

(30) Foreign Application Priority Data

Sep. 17, 2003    (JP)    ............................ P2003-324114

(51) Int. Cl.
*G03F 1/00*    (2006.01)
(52) U.S. Cl. ........................................................ 430/5
(58) Field of Classification Search .................... 430/5, 430/394; 403/322–324
See application file for complete search history.

(56) References Cited

U.S. PATENT DOCUMENTS 6,713,231 B1 *    3/2004    Hasegawa et al. .......... 430/311

* cited by examiner

*Primary Examiner*—S. Rosasco
(74) *Attorney, Agent, or Firm*—Sonnenschein Nath & Rosenthal LLP

(57) ABSTRACT

A photomask is proposed which comprises a transparent substrate and a light shielding film formed on a principal surface of the substrate, with the light shielding film having an aperture pattern thereon. And, a recess is provided at the portion of the transparent substrate which is exposed in the bottom of the aperture pattern. The dimension of the recess is larger than that of the aperture, and a peripheral portion of each of the aperture pattern of the light shielding film is configured as an eaves-like extension in response to the density of a neighboring pattern of the aperture pattern.

1 Claim, 3 Drawing Sheets

PHOTOMASK

CROSS REFERENCE TO RELATED APPLICATION

This application claims priority from Japanese Priority Application No. 2003-324114, filed on Sep. 17, 2003 with the Japanese Patent Office, the entire content of which is hereby incorporated by reference.

BACKGROUND OF THE INVENTION

1. Field of the Invention

The present invention relates to a photomask, more particularly to a photomask suitable in photo lithography to form fine patterns.

2. Description of Related Art

Currently, in a manufacturing process of a semiconductor device, photo lithography technique is mainly used to form patterns for semiconductor devices on a semiconductor substrate. In photo lithography, a mask pattern formed on a photomask is transferred onto a photo resist film applied for the semiconductor substrate by using projection photolithography apparatus, and a photo resist patterns is obtained by developing the photo resist film afterwards.

A photomask employed in the photolithography process is a photolithography negative plate having a pattern consisting of a transparent region and light shielding region. In case of reduction rate other than 1:1, the negative plate is referred to as a reticle. But, it is referred here to as a photomask in both cases.

In recent years, high integration of semiconductor device is highly advanced, and semiconductor device patterns is set to be more and more fine almost coming to the vicinity of resolution limit of photolithography apparatus. In pattern formation in the vicinity of such resolution limit, influence of optical proximity effect (OPE) becomes outstanding. It is a phenomenon that size and geometry of transferred pattern varies with this optical proximity effect affected by another neighboring pattern. If the influence of this optical proximity effect becomes outstanding, it is difficult to transfer a mask pattern onto a photo resist film in semiconductor substrate in desired size and geometry. Reduction of yield and increase of reproduction rate of semiconductor device are caused accordingly.

In order to reduce the influence of optical proximity effect, optical proximity correction (hereinafter referred to as OPC) technique is employed for manufacture of a photomask. It is a method which enables to get a photo resist pattern of nearly desired size and geometry of designed pattern by deforming a mask pattern from a designed pattern formed on a photomask, in consideration with the influence of optical proximity effect. As such OPC methods, a mask biasing, and model base OPC are proposed. A mask biasing (refer to the following Patent Document 1) is the one to change the size of a mask pattern in order to obtain a desired dimension. A model base OPC is the one to arrange a fine pattern called hammer head or jog, which dimension is lower than the resolution limit, in order to obtain a desired shape.

[Patent Document 1]

Japanese Patent Application Publication No. 9-304913 (cf. paragraph 0014 in particular)

FIG. 4 is a chart which shows an effect by an OPC of mask biasing, in which a line and space (L/S) patterns of 110 nm width are formed by the photomask adopting a mask bias OPC. In the chart, pitch of L/S patterns is plotted in horizontal axis, and a finished size (critical dimension) of photo resist pattern is plotted in vertical axis. As comparison, finished size (no OPC) of photo resist pattern of the photomask which was formed without OPC was shown. From this chart, it is understood that fluctuation of finished size for L/S pattern pitch can be controlled as small, by using the photomask which is manufactured by applying mask biasing OPC.

However, in a mask bias method described in the above, there is a problem that mask size can be only changed by a fixed pitch of discontinuous value when a mask pattern size is corrected against a designed pattern size. All the mask data for making an photomask and the exposure data of drawing device reside on the grid of equal interval both in x and y directions. And this grid size is determined by restriction in mask drawing device.

Presently, it is possible to set about 1.0 nm in size on a wafer (semiconductor substrate) for the smallest grid size. However, if a grid size is lessened, then it causes a problem that mask drawing hour is increased. Thus, when productivity is considered, it is necessary to keep grid size in a certain dimension. Thus, it is difficult to perform dimensional control of high accuracy in forming advanced fine patterns.

In particular, when a fine pattern is formed, which is designed as fine coming to the vicinity of the resolution limit of photolithography apparatus, problem occurs that influence of so-called MEF (mask error factor) grows bigger. That is, dimensional change of mask pattern is amplified against a photo resist pattern, and it is transferred. MEF is a proportionality constant when size fluctuation of mask pattern is transferred onto a photo resist pattern. For the case MEF=1.0, size fluctuation of mask pattern is transferred by 1:1 onto photo resist pattern, and size fluctuation of mask pattern in case of MEF=2.0, is transferred by 1:2 onto a photo resist pattern.

FIG. 5 shows a simulation consequence of MEF in pattern of the hole diameter of 120 nmφ with the pitch of 200 nm. But, it is calculated under the assumption that mask pattern of mask size 130 nmφ is transferred to a finished size (critical dimension) of photo resist pattern, in consideration of margin security in a manufacturing process. In addition, in FIG. 5, cases are disclosed wherein lens numerical aperture NA of photolithography apparatus is 0.70 and 0.75.

Based on this FIG. 5, it was found as shown in the following table 1, that size fluctuation of mask pattern become about 6-9 times, and is transferred onto a photo resist pattern when the value of MEF is calculated in the range of mask size=130±4 nmφ which is mask biased with ±4.0 nm against the designed pattern.

TABLE 1

| | CD [nm] | | | |
| --- | --- | --- | --- | --- |
| | | Mask design | | |
| NA | 126 | 130 | 134 | MEF |
| 0.7 | 86.2 | 120 | 160.5 | 9.3 |
| 0.75 | 96 | 120 | 147.3 | 6.4 |

Usually, mask bias is symmetrically applied with regard to the center of the mask pattern, that is, symmetric with right and left, and up and down. Thus, as mentioned above, if OPC by mask biasing is performed at the smallest grid 1.0 nm of mask drawing, at least mask bias of 2.0 nm (or mask bias of 1.0 nm right and left, or up and down) is applied. Suppose MFE is 6.0 according to the above mentioned simulation, size fluctuation of photo resist pattern is 12.0 nm. Thus, in actual condition, it is not possible to perform the dimensional control of photo resist pattern with accuracy of less than or equal to 12.0 nm in OPC by mask biasing.

And, as same as the mask biasing described above, in model-base OPC arranging a fine pattern less than or equal to the resolution limit as against design pattern, similar problem occurs so that there is a constraint in configuration of fine pattern.

SUMMARY OF THE INVENTION

Thus, the present invention provides a photomask with which photolithography can be performed compensating optical proximity effect without correcting design pattern itself, and it is aimed to enhance the dimension accuracy of fine pattern size formed by photolithography.

To accomplish such an aim, a photomask is proposed which comprises a transparent substrate and a light shielding film formed on a principal surface of the substrate, with the light shielding film having an aperture pattern thereon. And, a recess is provided at the portion of the transparent substrate which is exposed in the bottom of the aperture pattern. The dimension of the recess is larger than that of the aperture, and a peripheral portion of each of the aperture pattern of the light shielding film is configured as an eaves-like extension in response to the density of a neighboring pattern of the aperture pattern.

In a photomask of such a configuration, the recess provided at the portion of the transparent substrate which is exposed in the bottom of the aperture pattern, and a portion surrounded by the eaves-like-extension over the recess act as an optical waveguide of the exposure light which is incident from the transparent substrate side and passes through the aperture pattern. Because of this, the light intensity of the exposure light which passes aperture pattern through this optical waveguide, is compensated by optical waveguide effect. In photolithography, deviation in light intensity distribution of exposure light occurs in transferred surface of each aperture pattern by optical proximity effect of the magnitude in response to the density of a neighboring aperture pattern of the aperture pattern. As the above recess is provided in response to the density of a neighboring pattern of each aperture pattern, the deviation in light intensity caused by optical proximity effect can be corrected by the above described light waveguide effect.

As discussed above, according to a photomask of the present invention, it is possible to perform pattern exposure which corrects optical proximity effect without correcting designed pattern itself. By this, it enables to enhance the dimension accuracy of photolithography and to suppress the effect of MEF, even if fine pattern is employed, which pattern is in the vicinity of the resolution limit of photolithography apparatus.

DESCRIPTION OF THE PREFERRED EMBODIMENT

Hereinafter, based on the attached drawings, a photomask of the present invention is described precisely.

Figure 1A:
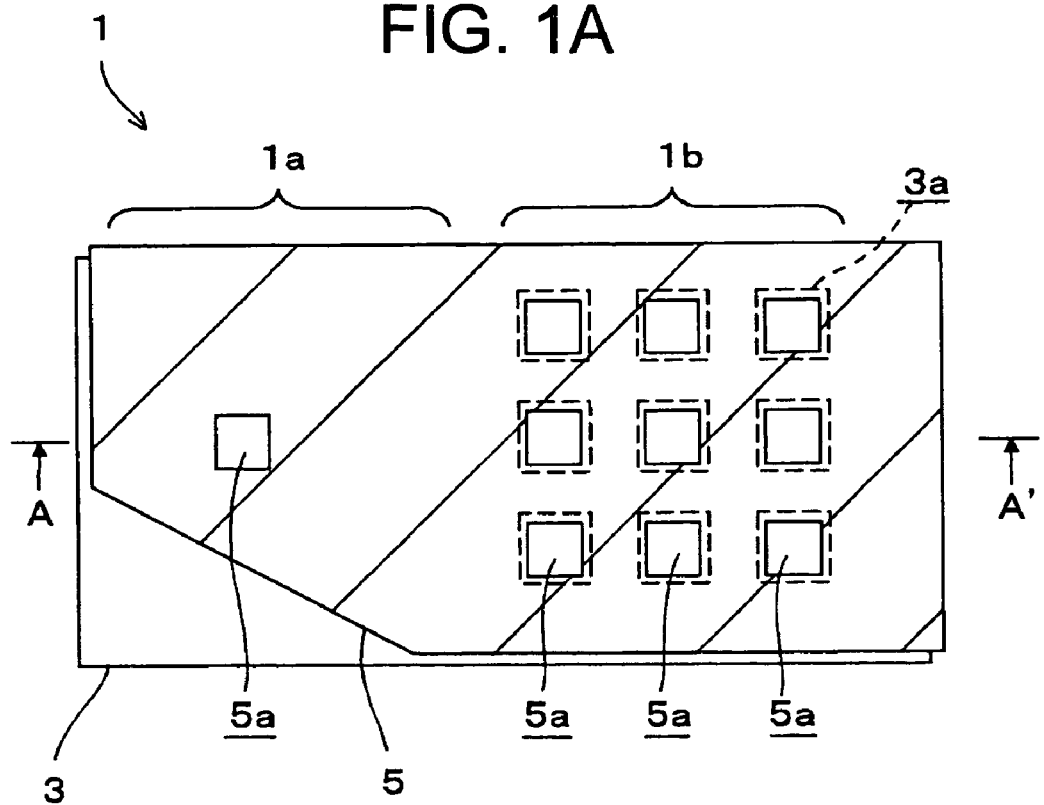
FIG. 1A and FIG. 1B are schematical views illustrating the structure of a photomask of an embodiment of the present invention.
Figure 1B:
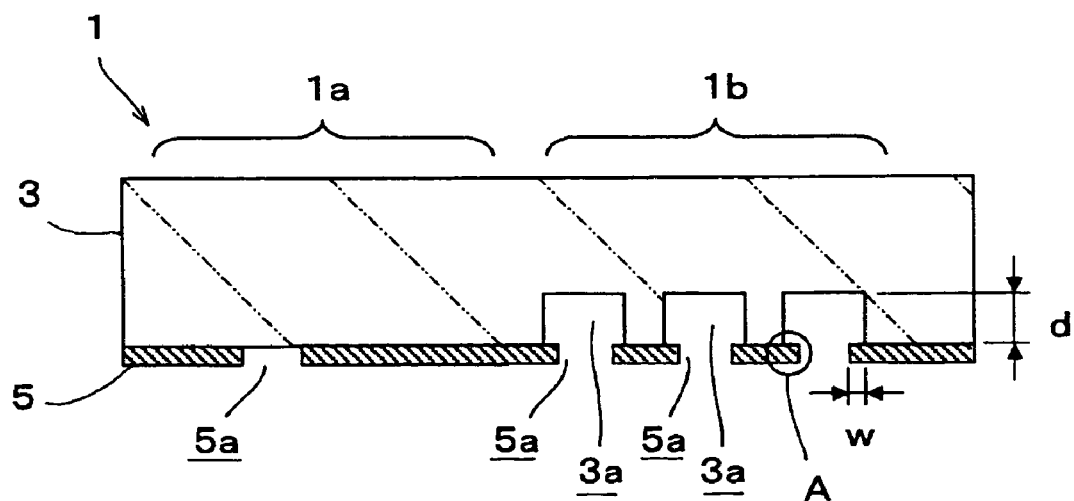

FIG. 1A is a plan view of a photomask 1 of an embodiment of the present invention, and FIG. 1B is a cross sectional view taken from the line A-A' in FIG. 1A. FIG. 1A is also a plan view which shows FIG. 1B from underneath. Photomask 1 shown in these figures is a photomask to be employed in photo lithography of pattern exposure. It is utilized, for example, to form a hole pattern for a contact hole in a positive type photo resist composition film in a manufacturing process of the semiconductor device such as LOGIC-based embedded DRAM.

This photomask 1 comprises a transparent substrate 3 and a light shielding film 5 formed on one principal surface of the transparent substrate 3.

A plurality of aperture pattern 5a is installed in light shielding film 5 in various arrangement. For example, an aperture pattern 5a is arranged as an isolated pattern in a first region 1a which corresponds to a logic forming region. Namely, each aperture is arranged with such an intervals so that exposure light passing through each aperture pattern 5a has no influence on each other. On the other hand, in a second region 1b which corresponds to a DRAM forming region, a plurality of aperture pattern 5a are densely arranged.

And, in particular in the second region 1b where each of aperture patterns are densely arranged, there is provided a recess 3a at the portion of the transparent substrate 3 which is exposed in the bottom of the aperture pattern 5a. In contrast with this, in the first region 1a where aperture pattern 1a is arranged as an isolated pattern, there is no recess at the portion of the transparent substrate 3 which is exposed in the bottom of the aperture pattern 5a.

Each recess 3a installed in the second region 1b has a larger dimension than that of the aperture pattern 5a. And, over the recess 3a, a peripheral portion of each of said aperture pattern of said light shielding film 5 is configured as an eaves-like extension.

Width w of the eaves-like extension of the light shielding film is configured to be an appropriate value in response to the density of a neighboring pattern of the aperture pattern 5a. Namely, this width w is set to be an appropriate value so that deviation of the light intensity distribution of each aperture pattern 5a caused by optical proximity effect on the transferred surface can be properly compensated.

In other words, as a recess 3a is provided at the portion of the transparent substrate 3, which is exposed in the bottom of the aperture pattern 5a, the recess 3a is made as an optical waveguide for the exposure light which is incident from the side of the transparent substrate 3, and passes through the aperture pattern 5a. Further, the fluctuation of light intensity distribution is controlled by this optical waveguide effect together with the eaves-like extension A.

The extent of this optical waveguide effect becomes larger when the width w of an eaves-like extension A becomes larger. Namely, this is determined by the width w of the eaves-like extension A, the depth d of the recess 3a, and the area S of the aperture pattern 5a. Accordingly, these values, that is, the width w of the eaves-like extension A, the depth d of the recess 3a, and the area S of the aperture pattern 5a, are configured so that deviation of the light intensity distribution caused by optical proximity effect is compensated by a simulation adopting the density of a neighboring pattern as one of the factors. The deviation of the light intensity distribution is caused by optical proximity effect on a transferred surface of the aperture pattern arranged with a certain neighboring pattern density.

For example, when the area S of aperture 5a is 0.05 $\mu m^2$, and the depth d of recess 3a is 340 nm, the width of eaves like extension A is set 100 nm. The light intensity thereof is the same as in portions provided with no recess. In the range that width w of the eaves-like extension is equal or greater than 100 nm, the light intensity is so increased in response to the width value.

Thus, in this case, by providing an eaves-like extension A over recess 3a in the second region 1b, which has the width w less than 100 nm, the light intensity is prevented from being increased by optical proximity effect occurring on the transferred surface of the aperture pattern 5a. And, the width w of eaves-like extension A in the second region 1b is configured so that the light intensity is prevented from being increased by optical proximity effect occurring on the transferred surface of the aperture pattern 5a in the second region 1b.

In addition, the width w of each eaves-like extension A is set to the same value, provided that aperture patterns arranged in the second region 1b have the same shape, depth of d of the recess 3a under each aperture pattern 5a is the same, aperture pattern 5a is arranged with an equal pitch, and the similar optical proximity effect occurs on the transferred surface. On the other hand, width w of each eaves-like extension A in each region is set to the different value, provided that a plurality of regions is configured in which aperture patterns are densely arranged by the extent that optical proximity effect extends to each other, and that the density of pattern arrangement in each region, that is, density of a neighboring pattern, is different from each other, even if aperture patterns arranged in each region 1b have the same shape, depth d of the recess 3a under each aperture pattern 5a is the same.

In addition, if depth d of recess 3a has the same value, the exposure light which passes through aperture pattern 5a arranged in the second region 1b, has the same phase. However, it is possible to change the depth d of each of neighboring recess 3a under the apertures 5a in response to wave length of the exposure light so that the phase difference of exposure light passing through neighboring aperture is reversed in order to prevent interference of the exposure light. In this case, as depth d of recess 3a in the second region 1b, is set to the different value between the neighboring recesses, the above described width w of the eaves-like extension can be set to the respective values in response to that. Further, aperture pattern 5a is arranged as an isolated pattern in the first region. Accordingly, it is not necessary to determine the depth d of the recess 3a under the aperture pattern 5a arranged in the second region 1b, in consideration of interference of the exposure light passing through aperture pattern 5a arranged in the first region 1a.

The above described transparent substrate and the light shielding film can be made of material which is generally used for a photomask for usual photolithography. For example, synthetic quartz (light transmission=100%) is used for the transparent substrate 3. For the light shielding film 5, material having the light transmission ranging 0 to 20% is utilized, such as chromium, molybdenum silicate (MoSi), and chromium fluoride (CrF) which is generally used as a halftone film for halftone phase shift mask, and so on.

Next, a manufacture of photomask 1 according to the configuration of the present invention will be explained below. First, fluctuation of light intensity distribution by optical proximity effect of aperture pattern on a transferred surface is calculated according to design data of aperture pattern 5a to be formed on the photomask 1. Peak width fluctuation of photo resist film formed on the transferred surface is calculated at the resolvable light intensity (I th). Then, the depth d of recess 3a provided at the portion of the transparent substrate 3 which is exposed in the bottom of aperture pattern 5a, and the width d of eaves-like extension A are respectively established with regard to each of aperture pattern 5a so that fluctuation of this light intensity distribution (peak width) is set to almost the same in the whole region on transferred surface.

After the depth d of recess 3a at each aperture pattern 5a and the width w of the eaves-like extension A are determined as described above, aperture pattern 5a is formed on the light shielding film 5 provided on a principal surface of transparent substrate 3. The aperture pattern may be configured as designed shape.

Subsequently, the aperture pattern 5a in the first region, which is not provided with recesses, are covered by a resist pattern (not shown in the drawings). Then, the bottom of each of aperture pattern 5a which are not covered by this resist pattern is isotropically etched. By this etching, a recess 3a is formed at the bottom of aperture pattern 5a in the second region 1b. Simultaneously, an eaves-like extension A is formed with a predetermined width w over each of the recess 3a from the peripheral portion of each of the aperture pattern 5a. Afterwards, etchant is changed from isotropic to anisotropic material, and the transparent substrate 3 is subject to etching so that depth of the recess 3a reaches a predetermined value set for the recess 3a. After removal of the resist pattern, a finished photomask is obtained.

Incidentally, in case the shape of recess 3a differs from each other with regard to respective aperture pattern 5a, the above described isotropical etching and the subsequent anisotropical etching are performed respectively with regard to each shape of recess 3a while other aperture pattern 5 which shape differs from the former, is covered by photo resist pattern.

As the photomask 1 is configured as described above, in the second region where aperture patterns 5a are densely provided, a recess 3a provided at the portion of the transparent substrate 3 which is exposed in the bottom of the aperture pattern 5a, and a portion surrounded by the eaves-like-extension A over the recess 3a act as an optical waveguide of the exposure light which is incident from the transparent substrate side and passes through the aperture pattern 5a. Because of this, the light intensity of the exposure light which passes through aperture pattern 5a, is compensated by optical waveguide effect.

Light intensity distribution of compensated exposure light is set in the level that variation of light intensity distribution can be compensated which occurs on the transferred surface caused by optical proximity effect in case of exposure with the use of this photomask 1. Accordingly, each aperture pattern 5a is transferred while light intensity distribution on each of the transferred surface is kept as the same, which corresponds to the first region 1a and the second region 1b where the density of pattern arrangement differs from each other. The photo resist pattern obtained by development after the exposure, has a small fluctuation in dimensional accuracy not depending upon the density of a neighboring pattern of the respective aperture 5a in the first region 1a and the second region 1b.

As a consequence to the above, according to a photomask of the present invention, it is possible to perform pattern exposure which corrects optical proximity effect without correcting aperture pattern 5a against the designed pattern. By this, it enables to enhance the dimension accuracy of photolithography and to suppress the effect of MEF, even if fine pattern is employed, which pattern is in the vicinity of the resolution limit of photolithography apparatus.

Figure 2A:
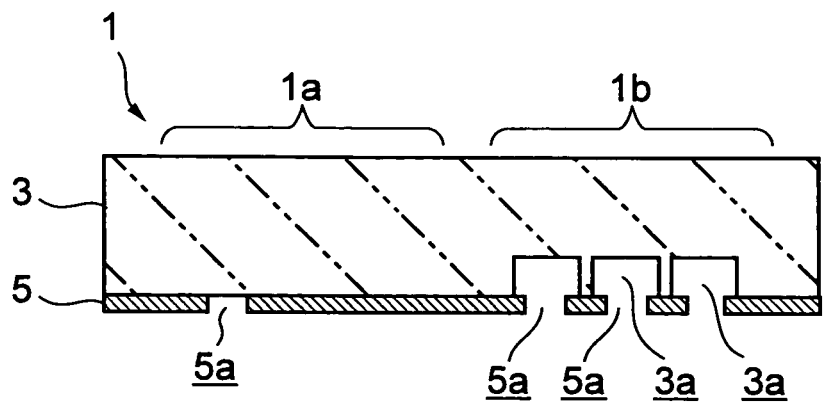
FIG. 2A and FIG. 2B respectively shows a photomask of the present invention and the simulation consequence of the photomask and the light intensity distribution.
Figure 2B:
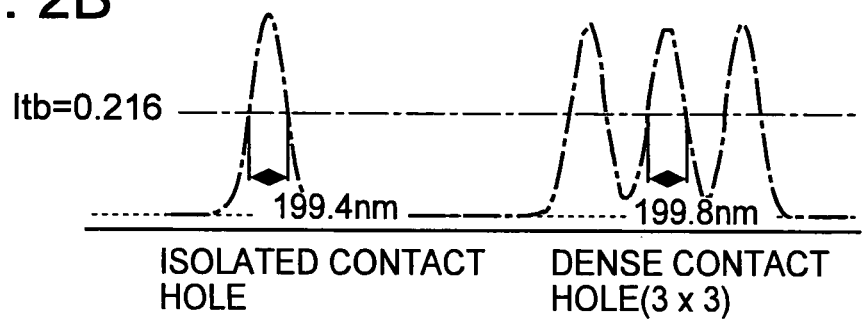
Figure 3A:
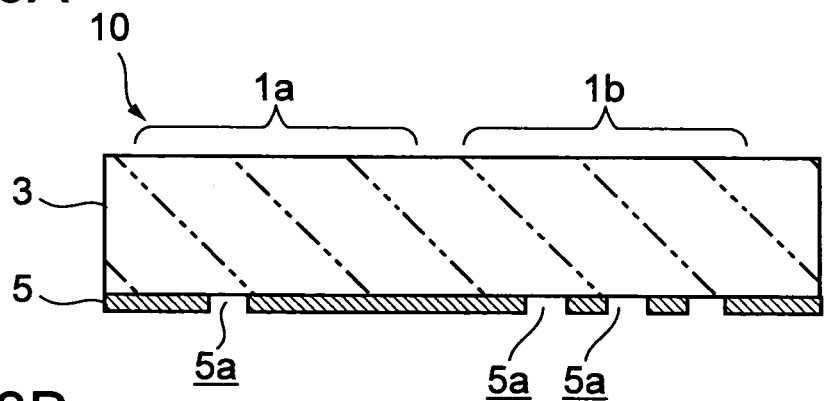
FIG. 3A and FIG. 3B respectively shows a compared photomask and simulation consequence of the compared photomask and light intensity distribution.

Photomask 1 and 10 are shown in FIG. 2A and FIG. 3A, which are directed to form a contact hole of aperture geometry of 200 nm×200 nm. The consequence of optical intensity simulation in exposure with the use of each photomask is shown in FIG. 2B and FIG. 3B.

A photomask 1 in FIG. 2A is a photomask of the embodiment described above, and a photomask 10 in FIG. 3A is a photomask which is provided with no recess in transparent substrate 3. These photomasks 1 and 10 differ only on the presence of recess 3a. In each of the first region 1a, there is provided aperture pattern 5a of 200 nm×200 nm as an isolated pattern, and in each of the second region 1b, there is provided aperture pattern 5a of 200 nm×200 nm arranged in three lines by 3 columns with pitch of 400 nm. The depth d of each recess 3a in photomask 1 shown in FIG. 2A is so configured that there is no phase difference produced in the exposure light (ArF light, wavelength of 193 nm). That is, the depth d of engraving is set to be 340 nm.

As the condition of simulation of light exposure with the use of each such photomask 1 and 10, exposure wavelength=248 nm, lens numerical aperture (NA)=0.75, coherent factor ($\sigma$)=0.75 were employed.

Figure 3B:
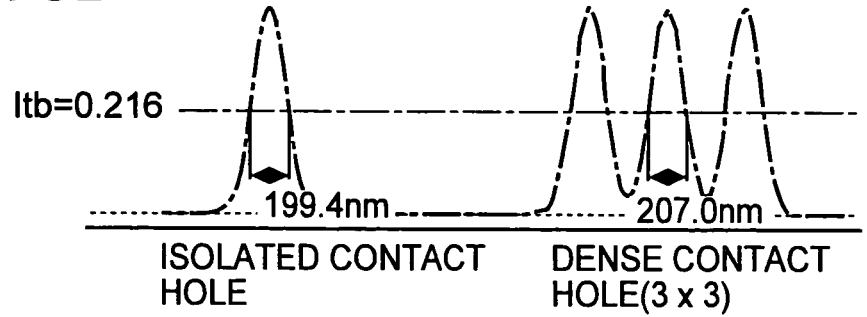
Figure 4:
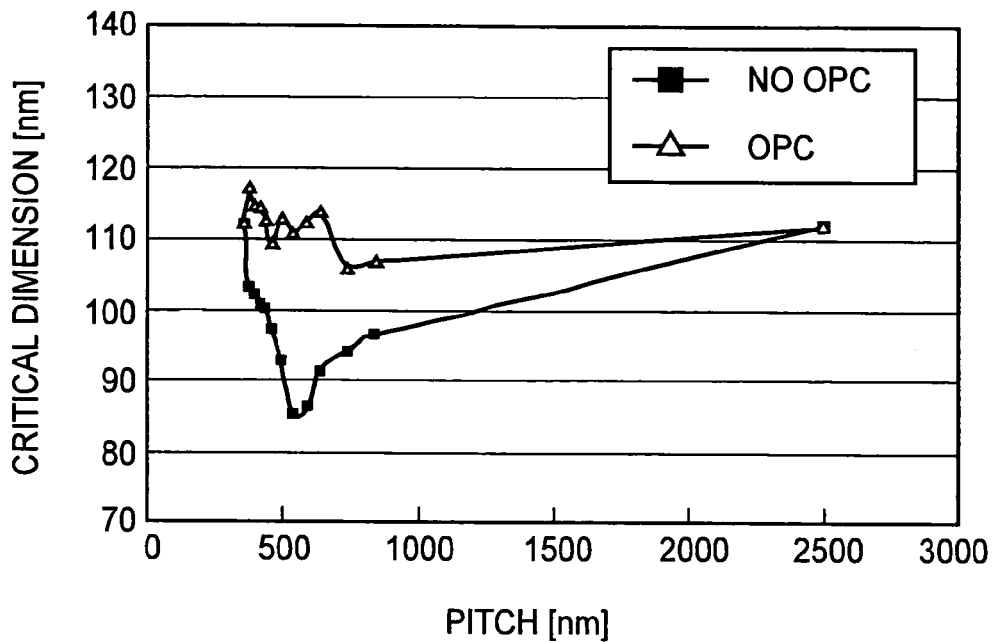
FIG. 4 is a chart illustrating the relation between the L/S pattern pitch and the finished size of photo resist pattern when mask bias OPC method was applied.
Figure 5:
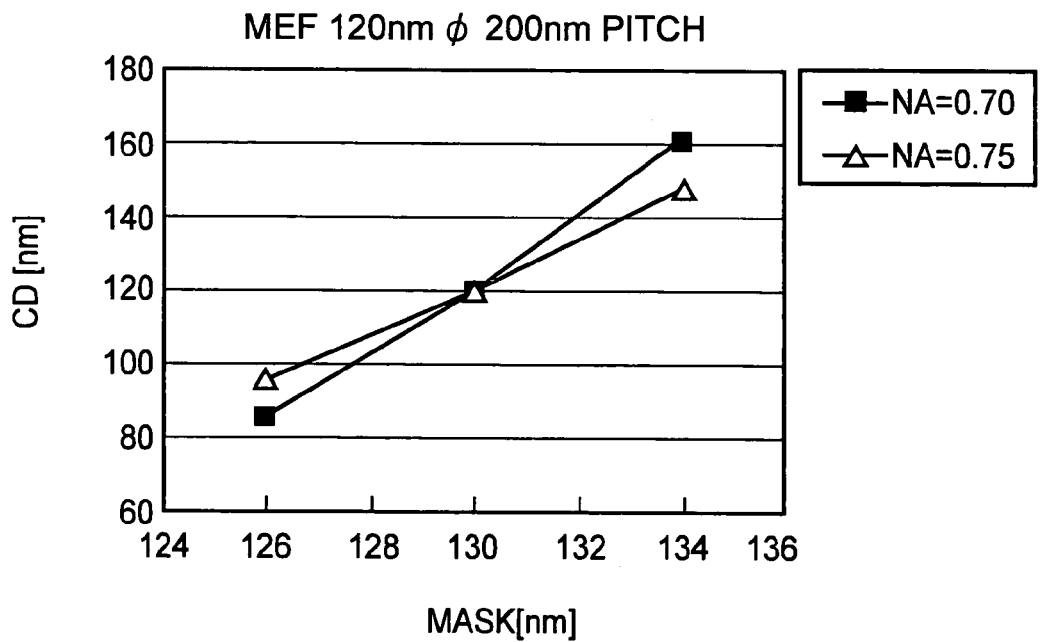
FIG. 5 is a chart illustrating the relation between the mask size in the vicinity of resolution limit and the finished size of photo resist pattern when mask bias OPC method was applied.

It is understood from FIG. 3B that when a photomask with no recess is used, peak width of light intensity distribution is much broader on the transferred surface in the second region 1b where aperture pattern is densely arranged, than that in the first region 1a, by the optical proximity effect. When an optical intensity (I th=0.216) is set as a slice level so that a contact hole (isolated contact hole) is formed to be 199.4 nm, it was found with the consequence that contact hole (dense contact hole) formed in the second region 1b has a dimension of 207.0 nm which is 7 nm bigger than that of desired one.

In contrast with this, as shown in FIG. 2B, when a photomask with recesses is used, optical proximity effect of exposure light is suppressed on the transferred surface in the second region 1b where aperture pattern 5a is densely arranged. The peak width of the light intensity distribution is almost equal to that in the first region 1a. And, under exposure of the same slice level (optical intensity I th=0.216), the dimension of isolated contact hole is obtained as 199.4 nm, and that of dense contact hole is 199.4 nm. It was confirmed that both of the contact holes were transferred with desired dimension.

In the embodiment explained above, a recess having an eaves-like extension is provided in the second region 1b where aperture pattern 5a is densely arranged. However, recess 3a having eaves-like extension A may be formed in the first region 1a where aperture pattern 5a is coarsely arranged. In that configuration, the width d of the eaves-like extension A may be properly adjusted. Thus, on the transferred surface, light intensity of exposure light passing through the aperture pattern 5a in the region with coarse aperture pattern, may be increased to a level of that passing through aperture pattern 5a in the region with dense aperture pattern. Accordingly, the peak width in the slice level becomes equal.

In the embodiment explained above, a positive type photo resist was employed for light exposure. However, negative type photo resist may be employed. In that case, similar effect can be obtained if light intensity distribution becomes equal without depending on the density of a neighboring pattern of each aperture pattern by providing a recess, with a width w of a eaves-like extension A being adjusted. For this case, a reverse pattern of an aperture pattern is formed in the photo resist film.

In addition, a photomask of the present invention may be used together with techniques of optical proximity correction such as conventional mask biasing and hammer head, and it enables to obtain combined advantages thereof.

In the embodiment explained above, the present invention is applied to an ordinary photomask (referred to as a binary mask) where a light shielding film 5 (light transmission of 0 to 20%) is provided on a transparent substrate 3 (light transmission of 100%). However, the present invention may be applied to a halftone phase shift mask or a Levenson-type phase shift mask. In that case, it enables to obtain the same effect as explained in the above embodiment. Also, it may be two-layer structure for light shielding film 5 not limited to one-layer structure.

What is claimed is:

1. A photomask comprising:
   a transparent substrate; and
   a light shielding film formed on a principal surface of said substrate, said light shielding film having an aperture pattern thereon;
   wherein a recess is provided at the portion of said transparent substrate which is exposed in the bottom of said aperture pattern, the dimension of which recess is larger than that of said aperture, and a peripheral portion of each of said aperture pattern of said light shielding film is configured as an eaves-like extension in response to the density of a neighboring pattern of said aperture pattern,
   wherein a width of said eaves-like extension of said light shielding film is respectively configured according to the density of a neighboring pattern of said aperture pattern.

* * * * *